United States Patent
Kim et al.

(10) Patent No.: US 9,885,816 B2
(45) Date of Patent: Feb. 6, 2018

(54) ANTIREFLECTION FILM AND ORGANIC LIGHT EMITTING DISPLAY DEVICE INCLUDING THE SAME

(71) Applicants: SAMSUNG ELECTRONICS CO., LTD., Suwon-si, Gyeonggi-do (KR); Samsung SDI Co., Ltd., Yongin-si, Gyeonggi-do (KR)

(72) Inventors: Hyung Jun Kim, Suwon-si (KR); Sangah Gam, Seoul (KR); Hye Young Kong, Uijeongbu-si (KR); Jong Hoon Won, Yongin-si (KR); Jong Hyuk Eun, Yongin-si (KR); Myungsup Jung, Seongnam-si (KR)

(73) Assignees: SAMSUNG ELECTRONICS CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/367,739

(22) Filed: Dec. 2, 2016

(65) Prior Publication Data

US 2017/0160453 A1    Jun. 8, 2017

(30) Foreign Application Priority Data

Dec. 2, 2015 (KR) ..................... 10-2015-0170770

(51) Int. Cl.
G02B 5/30 (2006.01)
H01L 51/52 (2006.01)
H01L 27/32 (2006.01)

(52) U.S. Cl.
CPC ......... *G02B 5/3083* (2013.01); *G02B 5/3016* (2013.01); *H01L 27/3244* (2013.01); *H01L 51/5281* (2013.01)

(58) Field of Classification Search
CPC . G02B 5/3016; G02B 5/3083; H01L 27/3244; H01L 51/5281
See application file for complete search history.

(56) References Cited

U.S. PATENT DOCUMENTS

| | | | |
|---|---|---|---|
| 9,389,352 B2 | 7/2016 | Iida et al. | |
| 2004/0066482 A1* | 4/2004 | Tanaka | G02B 5/3083 349/141 |
| 2006/0028601 A1* | 2/2006 | Kawahara | G02B 5/3083 349/117 |
| 2008/0151373 A1 | 6/2008 | Sekiguchi et al. | |
| 2012/0194767 A1* | 8/2012 | Kaihoko | G02F 1/133634 349/96 |
| 2014/0211311 A1 | 7/2014 | Harris et al. | |
| 2014/0293420 A1 | 10/2014 | Ko et al. | |

(Continued)

FOREIGN PATENT DOCUMENTS

| | | |
|---|---|---|
| KR | 1020140118595 A | 10/2014 |
| KR | 1020140125401 A | 10/2014 |

*Primary Examiner* — Allan R Wilson
(74) *Attorney, Agent, or Firm* — Cantor Colburn LLP (57) ABSTRACT

An antireflection film includes a polarizer, a first retardation film disposed on a side of the polarizer and having a reverse wavelength dispersion phase delay, and a second retardation film disposed on at least one side of the first retardation film and including a polymer, wherein the polymer includes a structural unit derived from a monomer selected from styrene, a styrene derivative, or a combination thereof, and the polymer has a glass transition temperature of greater than about 100° C.

18 Claims, 4 Drawing Sheets

(56) References Cited

U.S. PATENT DOCUMENTS

2015/0234106 A1* 8/2015 Nakamura ........... G02B 5/3083
                                                    349/96
2017/0052300 A1* 2/2017 Takeda .................... G02B 5/30

* cited by examiner

FIG. 4

ANTIREFLECTION FILM AND ORGANIC LIGHT EMITTING DISPLAY DEVICE INCLUDING THE SAME

CROSS-REFERENCE TO RELATED APPLICATION

This application claims priority to Korean Patent Application No. 10-2015-0170770, filed in the Korean Intellectual Property Office on Dec. 2, 2015, and all the benefits accruing therefrom under 35 U.S.C. § 119, the content of which in its entirety is herein incorporated by reference.

BACKGROUND

1. Field

The disclosure relates to an antireflection film and an organic light emitting display device including the same.

2. Description of the Related Art

Recently, applications requiring lighter and thinner monitors, televisions, and the like have been required, and an organic light emitting device (OLED) has drawn attention. The organic light emitting device needs no separate backlight because it is a self light-emitting display device, and thus may be used to provide a thin and flexible display device.

On the other hand, the organic light emitting device may reflect external light by a metal electrode and a metal line of the organic light emitting panel, and the visibility and the contrast ratio may be deteriorated by reflection of the exterior light, thereby reducing display quality. In order to reduce this, a circular polarizing plate may be attached to one surface of an organic light emitting panel and thus leakage of the reflected external light to the outside may be reduced. However, since a currently-developed circular polarizing plate has strong viewing angle dependency, visibility may be deteriorated toward the side.

SUMMARY

An embodiment provides an antireflection film capable of improving display characteristics by decreasing viewing angle dependency.

Another embodiment provides an organic light emitting device including the antireflection film.

According to an embodiment, an antireflection film includes a polarizer, a first retardation film disposed on a side of the polarizer and having a reverse wavelength dispersion phase delay, and a second retardation film disposed on at least one side of the first retardation film and consisting of a polymer,
wherein the polymer includes a structural unit derived from a monomer selected from styrene, a styrene derivative, or a combination thereof and the polymer has a glass transition temperature of greater than about 100° C.

The first retardation film having reverse wavelength dispersion phase delay may be a retardation film having λ/4 phase difference.

In-plane retardation ($R_{o1}$) for incident light at 450 nanometers (nm), 550 nm, and 650 nm wavelengths of the first retardation film may satisfy, for example Relationship Inequation 1.

$$R_{o1}(450 \text{ nm}) \leq R_{o1}(550 \text{ nm}) \leq R_{o1}(650 \text{ nm}) \quad \text{[Relationship Inequation 1]}$$

In Relationship Inequation 1,
$R_{o1}$ (450 nm) denotes in-plane retardation for incident light in a 450 nm wavelength of the first retardation film, $R_{o1}$ (550 nm) denotes in-plane retardation for incident light in a 550 nm wavelength of the first retardation film, and
$R_{o1}$ (650 nm) denotes in-plane retardation for incident light in a 650 nm wavelength of the first retardation film.

Wavelength dispersion of the first retardation film may satisfy, for example Relationship Inequation 2.

$$0.7 \leq R_{o1}(450 \text{ nm})/R_{o1}(550 \text{ nm}) \leq 1.0 \quad \text{[Relationship Inequation 2]}$$

In Relationship Inequation 2,
$R_{o1}$ (450 nm) denotes in-plane retardation for incident light in a 450 nm wavelength of the first retardation film, and
$R_{o1}$ (550 nm) denotes in-plane retardation for incident light in a 550 nm wavelength of the first retardation film.

The first retardation film may have refractive indices satisfying Relationship Inequation 3.

$$n_{x1} > n_{y1} = n_{z1} \quad \text{[Relationship Inequation 3]}$$

In Relationship Inequation 3,
$n_{x1}$ denotes a refractive index at a slow axis of the first retardation film,
$n_{y1}$ denotes a refractive index at a fast axis of the first retardation film, and
$n_{z1}$ denotes a refractive index in a direction perpendicular to $n_{x1}$ and $n_{y1}$.

The first retardation film may be a polymer film or a polymer film including a liquid crystal.

The second retardation film may have refractive indices satisfying Relationship Inequation 4.

$$n_{z2} > n_{x2} = n_{y2} \quad \text{[Relationship Inequation 4]}$$

In Relationship Inequation 4,
$n_{x2}$ denotes a refractive index in an in-plane x direction of the second retardation film,
$n_{y2}$ denotes a refractive index in an in-plane y direction of the second retardation film, and
$n_{z2}$ denotes a refractive index in a direction perpendicular to $n_{x2}$ and $n_{y2}$.

The second retardation film may satisfy retardation of Relationship Inequation 5 and 6.

$$-10 \text{ nm} < R_{o2}(550 \text{ nm}) \leq 10 \text{ nm} \quad \text{[Relationship Inequation 5]}$$

$$-200 \text{ nm} \leq R_{th2}(550 \text{ nm}) < -10 \text{ nm} \quad \text{[Relationship Inequation 6]}$$

In Relationship Inequations 5 and 6,
$R_{o2}$ (550 nm) denotes in-plane retardation in a 550 nm wavelength of the second retardation film, and
$R_{th2}$ (550 nm) denotes a thickness direction retardation in a 550 nm wavelength of the second retardation film.

The polymer may include a structural unit derived from styrene, a substituted or unsubstituted alkyl styrene, a substituted or unsubstituted aryl styrene, a halogen styrene, a substituted or unsubstituted alkoxy styrene, a substituted or unsubstituted nitro styrene, a substituted or unsubstituted amino styrene, a substituted or unsubstituted carboxyl styrene, or a combination thereof.

The polymer may further include a structural unit derived from a monomer selected from maleimide or a derivative thereof, maleic anhydride or a derivative thereof, acrylonitrile or a derivative thereof, methacrylonitrile or a derivative thereof, and a combination thereof.

The polymer may further include a structural unit derived from a monomer selected from acrylate or a derivative thereof, methacrylate or a derivative thereof, and a combination thereof.

The polymer may be a polymer including a structural unit derived from a monomer selected from styrene or a styrene derivative, a structural unit derived from a monomer selected from maleimide a derivative thereof, maleic anhydride or a derivative thereof, acrylonitrile or a derivative thereof, methacrylonitrile or a derivative thereof, and a combination thereof, and a structural unit derived from a monomer selected from acrylate or a derivative thereof, methacrylate or a derivative thereof, and a combination thereof.

The polymer may have a glass transition temperature of about 110° C. to about 150° C.

The second retardation film may be elongated about 1.1 times to about 5.0 times.

The second retardation film may be biaxially elongated.

The second retardation film may have a thickness of less than or equal to about 50 μm.

According to another embodiment, an organic light emitting display device including a display panel and the anti-reflection film is provided.

According to another embodiment, a method of manufacture for an antireflection film includes disposing a polarizer on a side of a first retardation film, the first retardation film having a reverse wavelength dispersion phase delay, and disposing a second retardation film on at least one side of the first retardation film to form the antireflection film, wherein the second retardation film further comprises a polymer, and wherein the polymer comprises a structural unit derived from a monomer selected from styrene, a styrene derivative, and a combination thereof, wherein the polymer has a glass transition temperature of greater than about 100° C.

BRIEF DESCRIPTION OF THE DRAWINGS

These and/or other features of the invention will become apparent and more readily appreciated from the following detailed description of embodiments thereof, taken in conjunction with the accompanying drawings, in which.

DETAILED DESCRIPTION

Exemplary embodiments of the present invention will hereinafter be described in detail, and may be easily performed by those who have common knowledge in the related art. However, this disclosure may be embodied in many different forms, and is not construed as limited to the exemplary embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise.

"Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, the term "substituted" refers to a group or compound substituted with at least one substituent selected from a halogen (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, ester group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof, instead of hydrogen of a compound.

As used herein, when a definition is not otherwise provided, the term "acrylate" refers to a (C1 to C12 alkyl) acrylate, and the term "methacrylate" refers to a (C1 to C12 alkyl) methacrylate.

Further as used herein, when a definition is not otherwise provided, an alkyl group is a C1 to C18 alkyl, or a C1 to C12 alkyl, or a C1 to C6 alkyl.

Hereinafter, an optical film according to an embodiment is described referring to the Figures.

Figure 1:
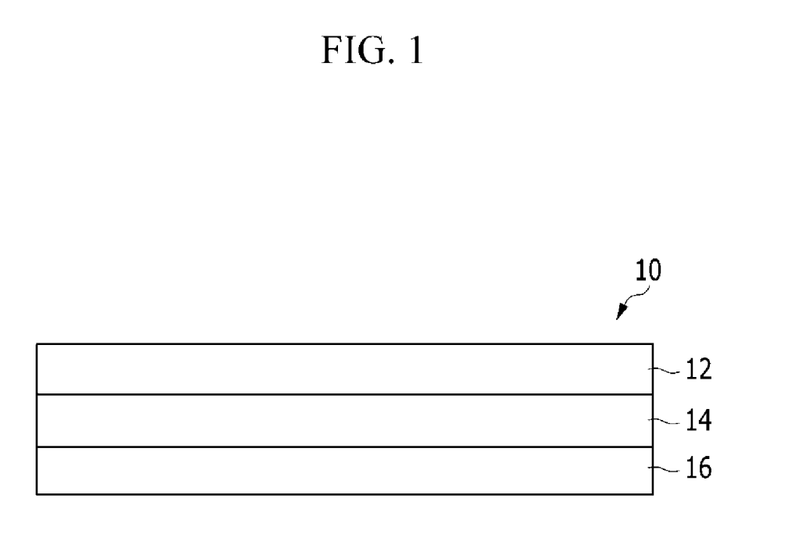
FIG. 1 is a schematic cross-sectional view showing an antireflection film according to an embodiment.

FIG. 1 is a schematic cross-sectional view showing an antireflection film according to an embodiment.

Referring to FIG. 1, an antireflection film 10 according to an embodiment includes a polarizer 12, a first retardation film 14 disposed on one side of the polarizer 12 and having a reverse wavelength dispersion phase delay, and a second retardation film 16 disposed on one side of the first retardation film consisting of a polymer.

The polarizer 12 is not particularly limited if incident unpolarized light is polarized and may be, for example a polarizing plate made of a polyvinyl alcohol (PVA) resin or a polarizing film including, but not limited to, a dichroic dye.

The polarizing plate may be, for example, formed by elongating a polyvinyl alcohol film, adsorbing iodine or a dichroic dye thereto, and treating it with boric acid and then washing the same. The polarizing film may be, for example, prepared by melt-blending a polymer and a dichroic dye, and the polarizing film may be, for example, made by mixing a polymer and a dye and melting the mixture at a temperature above the melting point of the polymer resin to manufacture it in a form of a sheet.

The first retardation film 14 including the reverse wavelength dispersion phase delay may be a λ/4 retardation film. The reverse wavelength dispersion phase delay indicates that a retardation of light at a longer wavelength is greater than a retardation of light at a shorter wavelength, and in-plane retardation ($R_{o1}$) in 450 nanometers (nm), 550 nm, and 650 nm wavelengths of the first retardation film 14 may satisfy, for example Relationship Inequation 1.

$R_{o1}(450\ nm) \leq R_{o1}(550\ nm) \leq R_{o1}(650\ nm)$     [Relationship Inequation 1]

In Relationship Inequation 1, $R_{o1}$ (450 nm) denotes in-plane retardation for incident light in a 450 nm wavelength of the first retardation film, $R_{o1}$ (550 nm) denotes in-plane retardation for incident light in a 550 nm wavelength of the first retardation film, and $R_{o1}$ (650 nm) denotes in-plane retardation for incident light in a 650 nm wavelength of the first retardation film.

Wavelength dispersion of the first retardation film 14 may satisfy, for example, Relationship Inequation 2.

$0.7 \leq R_{o1}(450\ nm)/R_{o1}(550\ nm) \leq 1.0$     [Relationship Inequation 2]

In Relationship Inequation 2, $R_{o1}$ (450 nm) denotes in-plane retardation for incident light in a 450 nm wavelength of the first retardation film, and $R_{o1}$ (550 nm) denotes an in-plane retardation for incident light in a 550 nm wavelength of the first retardation film.

For example, the wavelength dispersion of the first retardation film 14 may satisfy Relationship Inequation 2a.

$0.72 \leq R_{o1}(450\ nm)/R_{o1}(550\ nm) \leq 0.92$     [Relationship Inequation 2a]

For example, the wavelength dispersion of the first retardation film 14 may satisfy Relationship Inequation 2b.

$0.80 \leq R_{o1}(450\ nm)/R_{o1}(550\ nm) \leq 0.85$     [Relationship Inequation 2b]

The first retardation film 14 may satisfy refractive indices of Relationship Inequations 3 and 4.

$n_{x1} > n_{y1} = n_{z1}$     [Relationship Inequation 3]

In Relationship Inequation 3, $n_{x1}$ denotes a refractive index in a direction having a highest in-phase refractive index of the first retardation film 14 (hereinafter referred to as a "slow axis"), $n_{y1}$ denotes a refractive index in a direction having a lowest in-phase refractive index of the first retardation film 14 (hereinafter referred to as a "fast axis"), and $n_{z1}$ denotes a refractive index in a direction perpendicular to $n_{x1}$ and $n_{y1}$.

The first retardation film 14 satisfies refractive indices of Relationship Inequation 3 and is combined with the second retardation film 16 and thus may perform a retardation function by converting linearly polarized light passing the polarizer 12 into circularly polarized light.

In Relationship Inequation 3, $n_{y1}$ and $n_{z1}$ may be substantially equivalent or the same. As used herein, the term "substantially equivalent" means that the difference between $n_{y1}$ and $n_{z1}$ is less than or equal to about 0.001, for example less than or equal to about 0.01.

The retardation of the first retardation film 14 may be obtained as an in-plane retardation ($R_{o1}$) and a thickness direction retardation ($R_{th1}$). The in-plane retardation ($R_{o1}$) of the first retardation film 14 occurs in an in-plane direction and may be expressed as $R_{o1} = (n_{x1} - n_{y1})d_1$. The thickness direction retardation ($R_{th1}$) of the first retardation film 14 occurs in a thickness direction and may be expressed as $R_{th1} = \{[(n_{x1} + n_{y1})/2] - n_{z1}\}d_1$. Herein, the $d_1$ denotes a thickness of the first retardation film 14.

For example, the first retardation film 14 satisfying the refractive index of the Relationship Inequation 3 may satisfy, for example, retardation of Relationship Inequations 7 and 8.

$110\ nm \leq R_{o1}(550\ nm) \leq 160\ nm$     [Relationship Inequation 7]

$-250\ nm \leq R_{th1}(550\ nm) \leq 250\ nm$     [Relationship Inequation 8]

In Relationship Inequations 7 and 8, $R_{o1}$ (550 nm) denotes an in-plane retardation at 550 nm of the first retardation film 14, and $R_{th1}$ (550 nm) denotes a thickness direction retardation at 550 nm of the first retardation film 14.

The first retardation film 14 may be a polymer film without a liquid crystal or a polymer film including a liquid crystal. The first retardation film 14 may be an elongated polymer film having positive or negative birefringence. The first retardation film 14 may include, for example cycloolefin, polyacrylate, polymethacrylate, polycarbonate, polystyrene, polymaleimide, polyacrylonitrile, polymethacrylonitrile, polyethylene terephthalate, polybutylene terephthalate, cellulose, a combination thereof, a polymer thereof, a copolymer thereof, or a combination thereof, but is not limited thereto.

The first retardation film 14 may include a liquid crystal having positive or negative birefringence.

The liquid crystal may be an anisotropic liquid crystal, for example, a monomer, an oligomer, and/or a polymer having a rigid-rod shape.

The liquid crystal may be a reactive mesogen liquid crystal, and may include, for example, at least one mesogenic moiety and at least one polymerizable functional group. The reactive mesogen liquid crystal may include at least one of, for example, a rod-shaped aromatic derivative having at least one reactive cross-linking group, propylene glycol 1-methyl, propylene glycol 2-acetate, and a compound represented by $P^1-A^1-(Z^1-A^2)_n-P^2$ (wherein $P^1$ and $P^2$ independently include a polymerizable functional group such as acrylate, methacrylate, acryloyl, vinyl, vinyloxy, epoxy, or a combination thereof, $A^1$ and $A^2$ each independently include 1,4-phenylene, naphthalene-2,6-diyl group, or a combination thereof, $Z^1$ includes a single bond, —C(O)O—, —OCO—, or a combination thereof, and n is 0, 1, or 2), but is not limited thereto.

The first retardation film 14 may be formed in a single layer or a plurality of layers. When the first retardation film 14 is formed in a plurality of layers, the entire first retardation film consisting of the plurality of layers may satisfy the above conditions.

A second retardation film 16 is disposed on one side of the first retardation film 14. The second retardation film 16 may be an anisotropic polymer film. The second retardation film 16 may be, for example, a polymer film having a negative birefringence.

The second retardation film 16 may satisfy refractive indices of Relationship Inequation 4.

$$n_{z2} > n_{x2} = n_{y2} \quad \text{[Relationship Inequation 4]}$$

In Relationship Inequation 4, $n_{x2}$ denotes a refractive index in an in-plane x direction of the second retardation film 16, $n_{y2}$ denotes a refractive index in an in-plane y direction of the second retardation film 16, and $n_{z2}$ denotes a refractive index in a direction perpendicular to $n_{x2}$ and $n_{y2}$.

The second retardation film 16 satisfying a refractive index relationship of Relationship Inequation 4 may perform a viewing angle function to reduce reflectance and a reflection color at the side.

In Relationship Inequation 4, $n_{x2}$ and $n_{y2}$ may be substantially equivalent or the same. As used herein, "substantially equivalent" means that the difference between the $n_{x2}$ and $n_{y2}$ is less than or equal to about 0.001, for example, less than or equal to about 0.01.

The second retardation film 16 satisfying the Relationship Inequation 4 may have a substantially in-plane isotropy.

The second retardation film 16 may have retardation.

The retardation of the second retardation film 16 may be obtained as an in-plane retardation ($R_{o2}$) and a thickness direction retardation ($R_{th2}$). The in-plane retardation ($R_{o2}$) of the second retardation film 16 occurs in an in-plane direction of the second retardation film 16 and may be expressed as $R_{o2}=(n_{x2}-n_{y2})d_2$. The thickness direction retardation ($R_{th2}$) of the second retardation film 16 occurs in a thickness direction of the second retardation film 16 and may be expressed as $R_{th2}=\{[(n_{x2}+n_{y2})/2]-n_{z2}\}d_2$. Herein, the $d_2$ denotes a thickness of the second retardation film 16.

The second retardation film 16 may have an in-plane retardation and a thickness direction retardation within a desirable range by changing $n_{x1}$, $n_{y1}$, $n_{z1}$, and/or a thickness.

For example, the second retardation film 16 satisfying the refractive index of the Relationship Inequation 4 may satisfy, for example, retardation of Relationship Inequations 5 and 6.

$$-10 \text{ nm} < R_{o2}(550 \text{ nm}) \leq 10 \text{ nm} \quad \text{[Relationship Inequation 5]}$$

$$-200 \text{ nm} \leq R_{th2}(550 \text{ nm}) < -10 \text{ nm} \quad \text{[Relationship Inequation 6]}$$

In Relationship Inequations 5 and 6, $R_{o2}$ (550 nm) denotes in-plane retardation in a 550 nm wavelength of the second retardation film 16, and $R_{th2}$ (550 nm) denotes a thickness direction retardation in a 550 nm wavelength of the second retardation film 16.

The second retardation film 16 has a retardation satisfying Relationship Inequations 5 and 6 and thus reduces or offsets a thickness direction retardation ($R_{th2}$) and accordingly, may decrease viewing angle dependency and perform a compensation function.

When the first retardation film 14 is a polymer film without a liquid crystal, the second retardation film 16 may satisfy, for example, retardation of Relationship Inequation 6a-1.

$$-80 \text{ nm} \leq R_{th2}(550 \text{ nm}) \leq -40 \text{ nm} \quad \text{[Relationship Inequation 6a-1]}$$

When the first retardation film 14 includes a liquid crystal, the second retardation film 16 may satisfy, for example, retardation of Relationship Inequation 6a-2.

Within the ranges of Relationship Inequations 6a-1 and 6a-2, viewing angle dependency may effectively be offset and viewing angle compensation function may be improved.

$$-140 \text{ nm} \leq R_{th2}(550 \text{ nm}) \leq -100 \text{ nm} \quad \text{[Relationship Inequation 6a-2]}$$

The second retardation film 16 may include, for example, a heat resistant polymer having negative birefringence. The second retardation film 16 may not include a liquid crystal and therefore a film thickness may be uniformly controlled and compensation uniformity of viewing angles may be ensured. In addition, the second retardation film 16 comprising the polymer may have improved mechanical properties.

The polymer may include, for example, a structural unit derived from a monomer selected from styrene, a styrene derivative, and a combination thereof. The structural unit derived from a monomer selected from styrene, a styrene derivative, and a combination thereof may be, for example, a structural unit derived from a monomer selected from styrene, a substituted or unsubstituted alkyl styrene, a substituted or unsubstituted aryl styrene, a halogen styrene, a substituted or unsubstituted alkoxy styrene, a substituted or unsubstituted nitro styrene, a substituted or unsubstituted amino styrene, a substituted or unsubstituted carboxyl styrene, and a combination thereof, but is not limited thereto. For example, the structural unit derived from a monomer selected from styrene, a styrene derivative, and a combination thereof may be, for example a structural unit derived from a monomer selected from a substituted or unsubstituted C1 to C20 alkyl styrene, a substituted or unsubstituted C6 to C20 aryl styrene, a styrene substituted with one or two halogens (—F, —Cl, —Br, or —I), a substituted or unsubstituted C1 to C5 alkoxy styrene, a substituted or unsubstituted nitro styrene, a substituted or unsubstituted amino styrene, a substituted or unsubstituted carboxyl styrene, and a combination thereof, but is not limited thereto.

The polymer may further include, for example a structural unit derived from a monomer selected from maleimide, maleic anhydride, acrylonitrile, methacrylonitrile, a derivative of any monomer of the foregoing, and a combination thereof.

The structural unit derived from maleimide may be, for example a structural unit derived from maleimide, a substituted or unsubstituted alkyl maleimide, a substituted or unsubstituted cycloalkyl maleimide, a substituted or unsubstituted aryl maleimide, or a combination thereof, for example a structural unit derived from a substituted or unsubstituted C1 to C20 alkyl maleimide, a substituted or unsubstituted C3 to C20 cycloalkyl maleimide, a substituted or unsubstituted C6 to C20 aryl maleimide, or a combination thereof. The structural unit derived from maleimide may be, for example a structural unit derived from N-substituted maleimide, for example a structural unit derived from N-methylmaleimide, N-ethylmaleimide, N-isopropylmaleimide, N-butylmaleimide, N-isobutylmaleimide, N-t-butylmaleimide, N-n-hexylmaleimide, N-laurylmaleimide, N-cyclohexylmaleimide, N-phenylmaleimide, N-(2-methylphenyl)maleimide, N-(2-ethylphenyl)maleimide, N-(2-n- propylphenyl)maleimide, N-(2-isopropylphenyl)maleimide, N-(2,6-dimethylphenyl)maleimide, N-(2,6-diethylphenyl) maleimide, N-(2,6-diisopropylphenyl)maleimide, N-(2-chlorophenyl)maleimide, N-(2-bromophenyl)maleimide, N-(2-biphenyl)maleimide, N-(2-cyanophenyl)maleimide, or a combination thereof, but is not limited thereto.

The second retardation film 16 may further include a structural unit derived from a monomer selected from maleimide or a derivative thereof, maleic anhydride or a derivative thereof, acrylonitrile or a derivative thereof, methacrylonitrile or a derivative thereof, and a combination thereof and thus have a higher glass transition temperature, improving heat resistance. Thereby, reliability of a device may be improved.

The glass transition temperature ($T_g$) of the polymer of the second retardation film 16 may be for example higher than about 100° C., for example, about 110 to about 150° C., and for example about 120 to about 140° C. Thereby, heat resistance of the second retardation film 16 is improved and reliability of a device is improved.

The polymer may further include, for example, a structural unit derived from a monomer acrylate or a derivative thereof, methacrylate or a derivative thereof, and a combination thereof.

The structural unit derived from a monomer acrylate or a derivative thereof, methacrylate a derivative thereof, and a combination thereof may be, for example, a structural unit derived from acrylate, methacrylate, hydroxyalkyl acrylate, hydroxyalkyl methacrylate, carboxylalkyl acrylate, carboxylalkyl methacrylate, acryloyloxy alkyl succinic acid, methacryloyloxy alkyl succinic acid, acryloyloxy alkyl phthalic acid, methacryloyloxy alkyl phthalic acid, or a combination thereof, but is not limited thereto. Herein, the alkyl may be C1 to C10 alkyl.

The polymer may have, for example, a weight average molecular weight of about $5 \times 10^3$ to about $5 \times 10^6$. The polymer may have, for example a weight average molecular weight of about $5 \times 10^4$ to about $5 \times 10^5$.

In an exemplary embodiment, the polymer may be a polymer, for example a terpolymer including a structural unit derived from a monomer selected from styrene, a styrene derivative, and a combination thereof, a structural unit derived from a monomer selected from maleimide or a derivative thereof, maleic anhydride or a derivative thereof, acrylonitrile or a derivative thereof, methacrylonitrile or a derivative thereof, and a combination thereof, and a structural unit derived from a monomer selected from acrylate or a derivative thereof, methacrylate or a derivative thereof, and a combination thereof.

In an exemplary embodiment, the second retardation film 16 may be prepared by melt-extruding the above polymer into a sheet and elongating the sheet at a predetermined elongation rate. The melt-extrusion may be performed at greater than or equal to the melting point of the polymer, for example, at a temperature of about 200° C. to about 350° C. The elongating may be performed in a uniaxial direction at greater than or equal to the glass transition temperature of the polymer. In an exemplary embodiment, the elongating may be performed at a temperature that is about 50° C. greater than the glass transition temperature of the polymer.

The second retardation film 16 may be, for example, biaxially-elongated and may be, for example, elongated in a MD direction and in a TD direction. The second retardation film 16 may be about 1.1 times to about 5.0 times elongated (i.e., elongated by about 1.1 times to about 5.0 times), and may be, for example, about 1.2 times to about 3.0 times elongated.

The second retardation film 16 may have, for example, a thickness of less than or equal to about 50 micrometers (μm). For example, the thickness may be in a range of about 5 μm to about 40 μm, for example, about 5 μm to about 30 μm.

The second retardation film 16 may have positive (+) C plate characteristics that have a negative thickness direction retardation ($R_{th2}$). The second retardation film 16 combined with the first retardation film 14 may reduce side reflection characteristics and thus improve side reflection color.

The second retardation film 16 may be a single layer or a plurality of layers. When it is formed of a plurality of layers, the entire second retardation film provided by a combination of the plurality of layers may satisfy the conditions.

The polarizer 12, the first retardation film 14, and the second retardation film 16 may be sequentially laminated, or may be bonded by an adhesive.

A transparent protective film may be further disposed on the other side of the first retardation film 14 which does not contact the polarizer 12. The transparent protective film may be, for example, triacetyl cellulose (TAC), but is not limited thereto.

Figure 2:
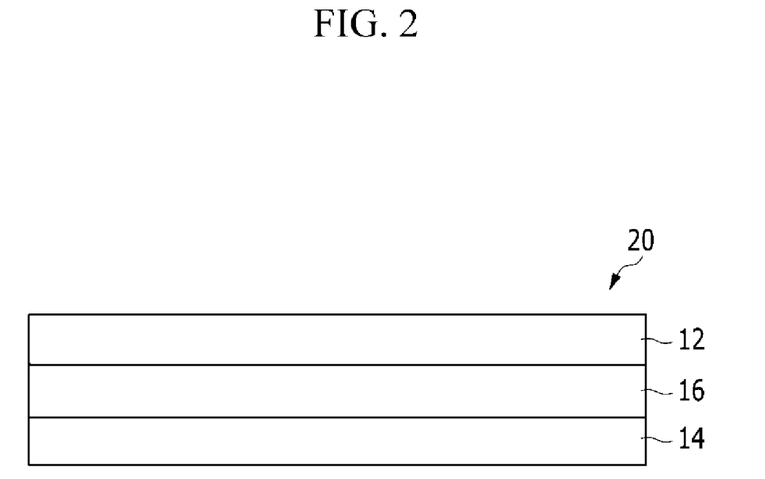
FIG. 2 is a schematic cross-sectional view showing an antireflection film according to an embodiment.

According to another embodiment, the polarizer 12 and the second retardation film 16 contact each other. An antireflection film 20 of such a structure is shown in FIG. 2. FIG. 2 is a schematic cross-sectional view showing an antireflection film according to an embodiment.

The antireflection films 10 and 20 are disposed at one side or both sides of a display device and may perform a polarizing function to which a compensation function is added. For example, the antireflection films 10 and 20 may prevent light from flowing into the display part of the display device from the outside (hereinafter referred to as 'external light') from being reflected. Accordingly, the antireflection films 10 and 20 may prevent the visibility deterioration caused by the external light reflection.

Figure 3:
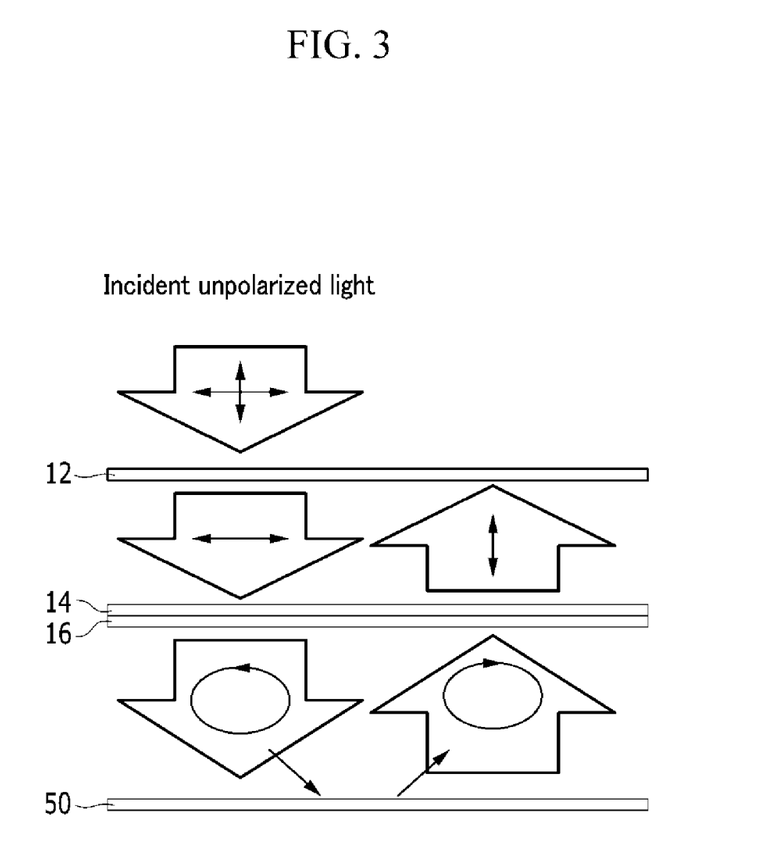
FIG. 3 is a schematic view showing the external light anti-reflection principle of an antireflection film according to an embodiment.

FIG. 3 is a schematic view showing the external light anti-reflection principle of the antireflection films 10 and 20.

Referring to FIG. 3, and without being bound to theory, while the incident unpolarized light having entered from the outside is passed through the polarizer 12, and the polarized light is shifted into circularly polarized light by passing through the first retardation film 14 and the second retardation film 16, only a first polarized perpendicular component, which is one polarized perpendicular component of two polarized perpendicular components, is transmitted. While the circularly polarized light is reflected in a display panel 50 including a substrate, an electrode, and so on, and changes the circular polarization direction, and the circularly polarized light is passed through the second retardation film 16 and the first retardation film 14 again, only a second polarized perpendicular component, which is the other polarized perpendicular component of the two polarized perpendicular components, may be transmitted. As the second polarized perpendicular component is not passed through the polarizer 12, and light does not exit to the outside, effects of preventing the external light reflection may be provided.

The antireflection film 10 may further include a correction layer (not shown) positioned on one side of the second retardation film 16. The correction layer may be, for example, a color shift resistant layer, but is not limited thereto.

The antireflection film 10 may further include a light blocking layer (not shown) extended along the edge. The light-blocking layer may be formed as a band along the circumference of the antireflection film 10, for example, positioned between the polarizer 12 and the first retardation film 14 and/or between the first retardation film 14 and the second retardation film 16. The light-blocking layer may include an opaque material, for example, a black material. For example, the light-blocking layer may be made of a black ink.

In this way, the antireflection film 10 according to the embodiment has the first retardation film 14 and the second retardation film 16 to which a compensation function is added and thus may improve a viewing angle and perform a compensation function.

Without being bound by theory, the second retardation film 16 may be prevented or reduced from degradation of optical properties due to heat generated during the process and/or the operation by reinforcing heat resistance with a polymer having a high glass transition temperature.

In addition, since the second retardation film 16 may be prepared through a process such as melt-extrusion, the process may be simplified unlike a conventional protection film such as triacetyl cellulose (TAC), thereby reducing a manufacturing cost and a unit price.

The antireflection films 10 and 20 may be applied to an organic light emitting display device.

A display device according to an embodiment includes a display panel and an antireflection film positioned on one side of the display panel. The display panel may be a liquid crystal panel or organic light emitting panel, but is not limited thereto.

Figure 4:
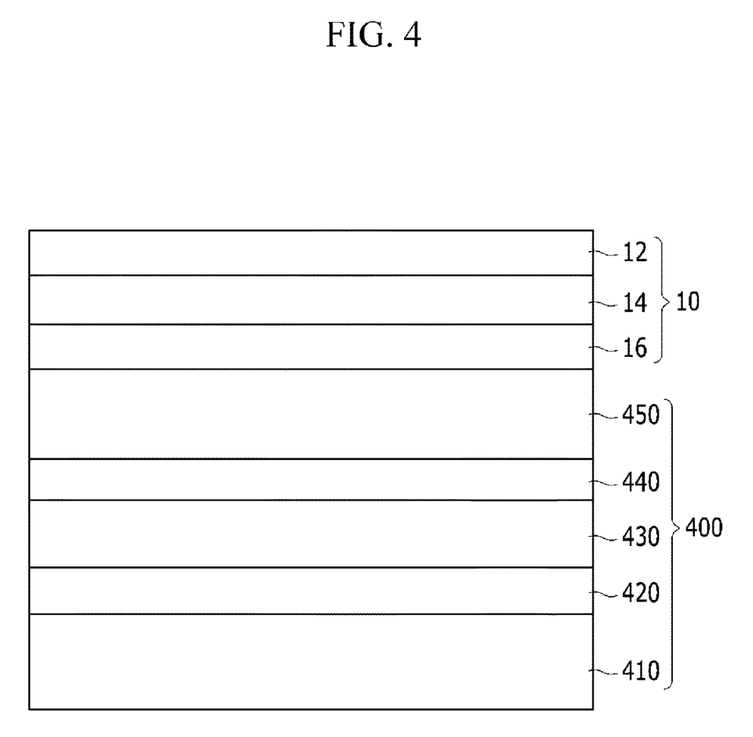
FIG. 4 is a schematic cross-sectional view showing an organic light emitting device according to an embodiment.

FIG. 4 is a cross-sectional view schematically showing an organic light emitting device according to an embodiment.

Referring to FIG. 4, the organic light emitting device according to an embodiment includes an organic light emitting panel 400 and antireflection films 10 and 20 positioned on one side of the organic light emitting panel 400.

The organic light emitting panel 400 includes a base substrate 410, a lower electrode 420, an organic emission layer 430, an upper electrode 440, and an encapsulation substrate 450.

The base substrate 410 may be made of glass or plastic.

At least one of the lower electrode 420 and the upper electrode 440 may be an anode, and the other may be a cathode. The anode is an electrode injected with holes, and may be made of a transparent conductive material having a high work function to transmit the emitted light to the outside, for example, ITO or IZO. The cathode is an electrode injected with electrons, and may be made of a conductive material having a low work function and not affecting the organic material, and may be selected from, for example, aluminum (Al), calcium (Ca), and barium (Ba).

In an exemplary embodiment, the organic emission layer 430 includes an organic material which may emit light when applying a voltage to the lower electrode 420 and the upper electrode 440.

An auxiliary layer (not shown) may be further provided between the lower electrode 420 and the organic emission layer 430 and between the upper electrode 440 and the organic emission layer 430. The auxiliary layer may be used to balance electrons and holes, and may include a hole transport layer, a hole injection layer (HIL), an electron injection layer (EIL), and an electron transporting layer.

The encapsulation substrate 450 may be made of glass, metal, or a polymer, and may seal the lower electrode 420, the organic emission layer 430, and the upper electrode 440 to prevent moisture and/or oxygen inflow from the outside.

The antireflection film 10 may be disposed on the light-emitting side. In an exemplary embodiment, in the case of a bottom emission structure emitting light at the side of the base substrate 410, the optical film 100 may be disposed on the exterior side of the base substrate 410, while on the other hand, in the case of a top emission structure emitting light at the side of the encapsulation substrate 450, the optical film 100 may be disposed on the exterior side of the encapsulation substrate 450.

The antireflection film 10 includes the transparent protective film 18, the polarizer 12, the first retardation film 14, and the second retardation film 16 as described above. The transparent protective film 18, the polarizer 12, the first retardation film 14, and the second retardation film 16 are the same as described above, and may prevent a display device from having visibility deterioration caused by light inflowing from the outside after passing the polarizer 12 and being reflected by a metal such as an electrode and the like in the organic light emitting panel 400. Accordingly, display characteristics of the organic light emitting display may be improved. FIG. 4 shows a case applying the antireflection film 10 of FIG. 1, but the antireflection film 20 of FIG. 2 may be applied thereto.

Hereinafter, the present disclosure is illustrated in more detail with reference to examples. However, these examples are exemplary, and the present disclosure is not limited thereto.

EXAMPLE 1: MANUFACTURE OF ANTIREFLECTION FILM

A polyvinyl alcohol film (PS 60, Kuraray Inc.) is elongated at 25 μm, and iodine is adsorbed therein, preparing a polarizer.

A second retardation film having a thickness direction retardation ($R_{th}$) provided in Table 1 is prepared by 50 to 200% biaxially elongating a poly(styrene-methyl methacrylate-maleic anhydride) terpolymer film (DENKA Co. Ltd., Japan) (Tg=126° C.) in each MD and TD direction at about 130° C. to 160° C.

The elongated polyvinyl alcohol film, a first retardation film (WRS, Teijin Ltd.), and the second retardation film are bonded to have a structure shown in FIG. 1, manufacturing an antireflection film.

The first retardation film has an in-plane retardation ($R_{o1}$) of 145 nm and a thickness direction retardation ($R_{th1}$) of 70 nm.

The thickness direction retardation ($R_{th2}$) of the second retardation film is measured by using an Axoscan equipment (Axometrics Inc.), at a wavelength ranging 400 nm to 700 nm, and reflectance (R) of the antireflection film is calculated at an incidence angle of 45° and 65° by using a LCD Master (Shintech Inc., Japan). The results are provided in Table 1.

EXAMPLE 2: MANUFACTURE OF ANTIREFLECTION FILM

An antireflection film having a structure shown in FIG. 2 is manufactured by bonding the polyvinyl alcohol film and the second retardation film according to Example 1 and a first retardation film (WRS, Teijin Ltd.).

The thickness direction retardation ($R_{th2}$) of the second retardation film and the reflectance (R) of the antireflection film are measured by using LCD Master in the same method as in Example 1. The results are provided in Table 1.

COMPARATIVE EXAMPLE 1: MANUFACTURE OF ANTIREFLECTION FILM

The polyvinyl alcohol film according to Example 1 and a first retardation film (WRS, Teijin Ltd.) are bonded to manufacture an antireflection film. The reflectance (R) of the antireflection film is calculated by using LCD Master (Shintech Inc., Japan). The results are provided in Table 1.

TABLE 1

| | Film Nos. | Thickness direction retardation ($R_{th2}$, nm) (@ 550 nm) | Reflectance (%) 45° | Reflectance (%) 65° |
|---|---|---|---|---|
| Example 1 | 1 | −40 | 0.30 | 0.58 |
| | 2 | −60 | 0.29 | 0.55 |
| | 3 | −80 | 0.30 | 0.58 |
| | 4 | −100 | 0.33 | 0.68 |
| Example 2 | 1 | −40 | 0.31 | 0.62 |
| | 2 | −60 | 0.30 | 0.59 |
| | 3 | −80 | 0.30 | 0.59 |
| | 4 | −100 | 0.31 | 0.62 |
| | 5 | −120 | 0.33 | 0.67 |
| Comparative Example 1 | | 0 | 0.35 | 0.74 |

Referring to Table 1, the antireflection film including the second retardation film having a thickness direction retardation ($R_{th2}$) ranging from −40 nm to −100 nm according to Example 1 and the antireflection film including the second retardation film having a thickness direction retardation ($R_{th2}$) ranging from −40 nm to −120 nm according to Example 2 show low reflectance compared with the antireflection film having no second retardation film according to Comparative Example 1.

EXAMPLE 3: MANUFACTURE OF ANTIREFLECTION FILM

An antireflection film having a structure shown in FIG. 1 is manufactured by bonding the polyvinyl alcohol film according to Example 1, a first retardation film (RMM1049, Merck & Co., Inc.), and the second retardation film according to Example 1.

The thickness direction retardation ($R_{th2}$) of the second retardation film and the reflectance (R) of the antireflection film are calculated in the same method as Example 1 by using LCD Master (Shintech Inc., Japan). The results are provided in Table 2.

EXAMPLE 4: MANUFACTURE OF ANTIREFLECTION FILM

An antireflection film having a structure shown in FIG. 2 is manufactured by bonding the polyvinyl alcohol film and the second retardation film according to Example 1 and a first retardation film (RMM1049, Merck & Co., Inc.).

The thickness direction retardation ($R_{th2}$) of the second retardation film and the reflectance (R) of the antireflection film are calculated in the same method as Example 1 by using LCD Master (Shintech Inc., Japan). The results are provided in Table 2.

COMPARATIVE EXAMPLE 2: MANUFACTURE OF ANTIREFLECTION FILM

An antireflection film is manufactured by bonding the polyvinyl alcohol film according to Example 1 and a first retardation film (RMM1049, Merck & Co., Inc.). The reflectance (R) of the antireflection film is calculated by using LCD Master. The results are provided in Table 2.

TABLE 2

| | Film Nos. | Thickness direction retardation ($R_{th2}$, nm) (@ 550 nm) | Reflectance (%) 45° | Reflectance (%) 65° |
|---|---|---|---|---|
| Example 3 | 1 | −100 | 0.41 | 0.92 |
| | 2 | −120 | 0.4 | 0.89 |
| | 3 | −140 | 0.4 | 0.89 |
| | 4 | −170 | 0.41 | 0.91 |
| Example 4 | 1 | −60 | 0.35 | 0.72 |
| | 2 | −80 | 0.32 | 0.61 |
| | 3 | −100 | 0.31 | 0.56 |
| | 4 | −120 | 0.31 | 0.57 |
| | 5 | −140 | 0.34 | 0.64 |
| | 6 | −170 | 0.38 | 0.77 |
| Comparative Example 2 | | 0 | 0.56 | 1.41 |

Referring to Table 2, the antireflection film having the thickness direction retardation ($R_{th2}$) of the second retardation film within a range of −100 nm to −170 nm according to Example 3 and the antireflection film having the thickness direction retardation ($R_{th2}$) of the second retardation film within a range of −60 nm to −170 nm according to Example 4 show less reflectance compared with the antireflection film having no second retardation film according to Comparative Example 2.

Manufacture of Display Device

EXAMPLE 5

An organic light emitting display device is manufactured by adhering the antireflection film including the second retardation film having a thickness direction retardation ($R_{th2}$) of −60 nm according to Example 1 to one side of an organic light emitting panel (galaxy S5 panel, Samsung Display).

EXAMPLE 6

An organic light emitting display device is manufactured by adhering the antireflection film including the second retardation film having a thickness direction retardation ($R_{th2}$) of −60 nm according to Example 2 to one side of an organic light emitting panel (galaxy S5 panel, Samsung Display).

EXAMPLE 7

An organic light emitting display device is manufactured by adhering the antireflection film including the second retardation film having a thickness direction retardation ($R_{th2}$) of −120 nm according to Example 3 to one side of an organic light emitting panel (galaxy S5 panel, Samsung Display).

EXAMPLE 8

An organic light emitting display device is manufactured by adhering the antireflection film including the second retardation film having a thickness direction retardation ($R_{th2}$) of −100 nm according to Example 4 to one side of an organic light emitting panel (galaxy S5 panel, Samsung Display).

COMPARATIVE EXAMPLE 3

An organic light emitting display device is manufactured by adhering the antireflection film according to Comparative Example 1 to one side of an organic light emitting panel (galaxy S5 panel, Samsung Display).

COMPARATIVE EXAMPLE 4

An organic light emitting display device is manufactured by adhering the antireflection film according to Comparative Example 2 to one side of an organic light emitting panel (galaxy S5 panel, Samsung Display).

The reflectance (R) and reflection color (Δa*b*) of the organic light emitting display devices according to Examples 5 to 8 and Comparative Examples 3 and 4 are evaluated.

The reflectance (R) and reflection color (Δa*b*) at the sides of the organic light emitting display devices are evaluated by using a display measurement systems (DMS, Instrument Systems), while light is supplied under a reflection condition of 45° and 65° of a light source.

The reflection color may be evaluated by using a CIE-Lab color coordinator, and herein, positive a* displays red, negative a* displays green, positive b* displays yellow, and negative b* displays blue, and the colors are stronger as the a* and b* have a larger absolute value. The results of Example 6 and Comparative Example 3 are provided in Table 3.

TABLE 3

|  | 45° reflection | | 65° reflection | |
| --- | --- | --- | --- | --- |
|  | R (%) | Δa*b* | R (%) | Δa*b* |
| Example 6 | 0.8 | 4.1 | 1.5 | 5.2 |
| Comparative Example 3 | 1.1 | 5.3 | 1.8 | 5.7 |

Referring to Table 3, the organic light emitting display device according to Example 6 shows improved reflectance and a small reflection color value at the side compared with the organic light emitting display device according to Comparative Example 3. The organic light emitting display device having a small reflection color value displays a color close to black due to reflection and a small color change and shows satisfactory visibility due to reflection of external light.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An antireflection film comprising
a polarizer,
a first retardation film disposed on a side of the polarizer and having a reverse wavelength dispersion phase delay, and
a second retardation film disposed on at least one side of the first retardation film and consisting of a polymer,
wherein the polymer comprises a structural unit derived from a monomer selected from styrene, a styrene derivative, or a combination thereof, and the polymer has a glass transition temperature of greater than about 100° C.

2. The antireflection film of claim 1, wherein the first retardation film having the reverse wavelength dispersion phase delay is a retardation film having a λ/4 phase difference.

3. The antireflection film of claim 1, wherein an in-plane retardation for incident light at 450 nanometers, 550 nanometers, and 650 nanometer wavelengths of the first retardation film satisfies Relationship Inequation 1:

$$R_{o1}(450\ nm) \le R_{o1}(550\ nm) \le R_{o1}(650\ nm)$$  Relationship Inequation 1 wherein, in Relationship Inequation 1,
$R_{o1}$ (450 nm) denotes the in-plane retardation for incident light at 450 nanometers wavelength of the first retardation film,
$R_{o1}$ (550 nm) denotes the in-plane retardation for incident light at 550 nanometers wavelength of the first retardation film, and
$R_{o1}$ (650 nm) denotes the in-plane retardation for incident light at 650 nanometers wavelength of the first retardation film.

4. The antireflection film of claim 1, wherein a wavelength dispersion of the first retardation film satisfies Relationship Inequation 2:

$$0.7 \le R_{o1}(450\ nm)/R_{o1}(550\ nm) \le 1.0$$  Relationship Inequation 2 wherein, in Relationship Inequation 2,
$R_{o1}$ (450 nm) denotes the in-plane retardation for incident light at 450 nanometers wavelength of the first retardation film, and
$R_{o1}$ (550 nm) denotes the in-plane retardation for incident light at 550 nanometers wavelength of the first retardation film.

5. The antireflection film of claim 1, wherein the first retardation film further comprises refractive indices satisfying Relationship Inequation 3:

$$n_{x1} > n_{y1} = n_{z1}$$  Relationship Inequation 3 wherein, in Relationship Inequation 3,
$n_{x1}$ denotes a refractive index at a slow axis of the first retardation film,
$n_{y1}$ denotes a refractive index at a fast axis of the first retardation film, and
$n_{z1}$ denotes a refractive index in a direction perpendicular to $n_{x1}$ and $n_{y1}$.

6. The antireflection film of claim 1, wherein the first retardation film is a polymer film or a polymer film comprising a liquid crystal.

7. The antireflection film of claim 1, wherein the second retardation film further comprises refractive indices satisfying Relationship Inequation 4:

$$n_{z2} > n_{x2} = n_{y2}$$  Relationship Inequation 4 wherein, in Relationship Inequation 4,
$n_{x2}$ denotes a refractive index in an in-plane x direction of the second retardation film,
$n_{y2}$ denotes a refractive index in an in-plane y direction of the second retardation film, and
$n_{z2}$ denotes a refractive index in a direction perpendicular to $n_{x2}$ and $n_{y2}$.

8. The antireflection film of claim 1, wherein an in-plane retardation and a thickness direction retardation of the second retardation film satisfies Relationship Inequations 5 and 6:

$$-10\ nanometers < R_{o2}(550\ nm) \le 10\ nanometers$$  Relationship Inequation 5

$$-200\ nanometers \le R_{th2}(550\ nm) < -10\ nanometers$$  Relationship Inequation 6 wherein, in Relationship Inequations 5 and 6,
$R_{o2}$ (550 nm) denotes the in-plane retardation at 550 nanometers wavelength of the second retardation film, and $R_{th2}$ (550 nm) denotes the thickness direction retardation at 550 nanometers wavelength of the second retardation film.

9. The antireflection film of claim 1, wherein the polymer comprises a structural unit derived from styrene, a substituted or unsubstituted alkyl styrene, a substituted or unsubstituted aryl styrene, halogen styrene, a substituted or unsubstituted alkoxy styrene, a substituted or unsubstituted nitro styrene, a substituted or unsubstituted amino styrene, a substituted or unsubstituted carboxyl styrene, or a combination thereof.

10. The antireflection film of claim 9, wherein the polymer further comprises a structural unit derived from a monomer selected from maleimide or a derivative thereof, maleic anhydride or a derivative thereof, acrylonitrile or a derivative thereof, methacrylonitrile or a derivative thereof, and a combination thereof.

11. The antireflection film of claim 10, wherein the polymer comprises a structural unit derived from a monomer selected from acrylate or a derivative thereof, methacrylate or a derivative thereof, and a combination thereof.

12. The antireflection film of claim 1, wherein the polymer comprises
 a polymer comprising:
 a first structural unit derived from a monomer selected from styrene or a styrene derivative,
 a second structural unit derived from a monomer selected from maleimide or a derivative thereof, maleic anhydride or a derivative thereof, acrylonitrile a derivative thereof, methacrylonitrile or a derivative thereof, and a combination thereof, and
 a structural unit derived from a monomer selected from an acrylate or a derivative thereof, a methacrylate or a derivative thereof, and a combination thereof.

13. The antireflection film of claim 1, wherein the polymer has a glass transition temperature of about 110° C. to about 150° C.

14. The antireflection film of claim 1, wherein the second retardation film is elongated by about 1.1 times to about 5.0 times.

15. The antireflection film of claim 11, wherein the second retardation film is biaxially elongated.

16. The antireflection film of claim 1, wherein the second retardation film has a thickness of less than or equal to about 50 μm.

17. An organic light emitting display device comprising
 a display panel, and
 the antireflection film of claim 1.

18. A method of manufacture for an antireflection film comprising
 disposing a polarizer on a side of a first retardation film, the first retardation film having a reverse wavelength dispersion phase delay, and
 disposing a second retardation film on at least one side of the first retardation film to form the antireflection film, wherein the second retardation film further comprises a polymer, and
 wherein the polymer comprises a structural unit derived from a monomer selected from styrene, a styrene derivative, and a combination thereof, wherein the polymer has a glass transition temperature of greater than about 100° C.

* * * * *